(12) United States Patent
Rosenbluth et al.

(10) Patent No.: US 7,181,568 B2
(45) Date of Patent: Feb. 20, 2007

(54) CONTENT ADDRESSABLE MEMORY TO IDENTIFY SUBTAG MATCHES

(75) Inventors: Mark B. Rosenbluth, Uxbridge, MA (US); Gilbert Wolrich, Framingham, MA (US)

(73) Assignee: Intel Corporation, Santa Clara, CA (US)

( * ) Notice: Subject to any disclaimer, the term of this patent is extended or adjusted under 35 U.S.C. 154(b) by 353 days.

(21) Appl. No.: 10/811,288

(22) Filed: Mar. 25, 2004

(65) Prior Publication Data

US 2005/0216656 A1 Sep. 29, 2005

(51) Int. Cl.
*G06F 12/00* (2006.01)

(52) U.S. Cl. .............. 711/108; 711/3; 365/49
(58) Field of Classification Search .............. None
See application file for complete search history.

(56) References Cited

U.S. PATENT DOCUMENTS

| | | | |
|---|---|---|---|
| 5,450,351 A | 9/1995 | Heddes | |
| 5,796,976 A | 8/1998 | Shah et al. | |
| 5,806,083 A | 9/1998 | Edgar | |
| 6,097,724 A | 8/2000 | Kartalopoulos | |
| 6,240,003 B1 * | 5/2001 | McElroy | 365/49 |
| 6,259,620 B1 * | 7/2001 | Kling et al. | 365/49 |
| 6,307,789 B1 | 10/2001 | Wolrich et al. | |
| 6,324,624 B1 | 11/2001 | Wolrich et al. | |
| 6,427,196 B1 | 7/2002 | Adiletta et al. | |
| 6,463,072 B1 | 10/2002 | Wolrich et al. | |
| 6,577,542 B2 | 6/2003 | Wolrich et al. | |
| 6,606,704 B1 | 8/2003 | Adiletta et al. | |
| 6,622,204 B1 * | 9/2003 | Jones et al. | 711/108 |
| 6,667,920 B2 | 12/2003 | Wolrich et al. | |
| 6,668,317 B1 | 12/2003 | Bernstein et al. | |
| 6,681,300 B2 | 1/2004 | Wolrich et al. | |
| 6,728,845 B2 | 4/2004 | Adiletta et al. | |
| 6,779,084 B2 | 8/2004 | Wolrich et al. | |
| 6,809,320 B2 | 10/2004 | Iida et al. | |
| 6,868,476 B2 | 3/2005 | Rosenbluth et al. | |
| 6,876,561 B2 | 4/2005 | Wolrich et al. | |
| 2003/0191866 A1 | 10/2003 | Wolrich et al. | |
| 2003/0225965 A1 | 12/2003 | Krishnan | |
| 2003/0235194 A1 | 12/2003 | Morrison | |
| 2004/0139275 A1 | 7/2004 | McKenzie et al. | |

OTHER PUBLICATIONS

Description and Diagram of Conventional CAM in Intel's IXP2400 Network Processor; one page.
Intel Technology Journal, The Next Generation of Intel IXP Network Processors, vol. 06, Issue 03, Aug. 15, 2002, pp. 6-18.
Grosspietsch: Associative Processors and Memories: A Survey; IEEE Micro, 1992; pp. 12-19.
Pending U.S. Appl. No. 10/811,125, filed Mar. 25, 2006, inventor: Rosenbluth; office action dated Sep. 19, 2006.

* cited by examiner

*Primary Examiner*—Kevin Verbrugge
(74) *Attorney, Agent, or Firm*—Robert A. Greenberg

(57) ABSTRACT

The disclosure includes a description of a content addressable memory (CAM) that includes at least one tag input and at least one random access memory. The CAM also includes circuitry to perform multiple read operations of the at least one random access memory with multiple, different ones of the read operations specifying an address based on different subsets of tag bits. The circuitry includes digital logic circuitry coupled to the at least one random access memory to determine whether a lookup tag matches a subset of the different subsets of tag bits.

21 Claims, 15 Drawing Sheets

US 7,181,568 B2

CONTENT ADDRESSABLE MEMORY TO IDENTIFY SUBTAG MATCHES

REFERENCE TO RELATED APPLICATIONS

This relates to U.S. Patent Application entitled "Content Addressable Memory Constructed From Random Access Memory" filed on the same day as the present application.

BACKGROUND

Different kinds of memory provide different ways to access data. For example, FIG. 1A depicts a type of memory known as a "random access memory" or RAM. RAM stores data at different addresses in memory. For example, as shown, when the binary address "0001" is applied in a read operation, the RAM outputs the value, "b", stored at that address.

FIG. 1B illustrates a different kind of memory known as a "content addressable memory" or a CAM. As shown, the CAM stores different data values (e.g., "a", "b", and "c") known as "tags". In response to a given lookup tag, the CAM can determine if the lookup tag matches or "hits" a previously written tag. For example, as shown, a search for lookup tag "b" results in a "hit" since "b" was previously written to the CAM.

DETAILED DESCRIPTION

Figure 1B:
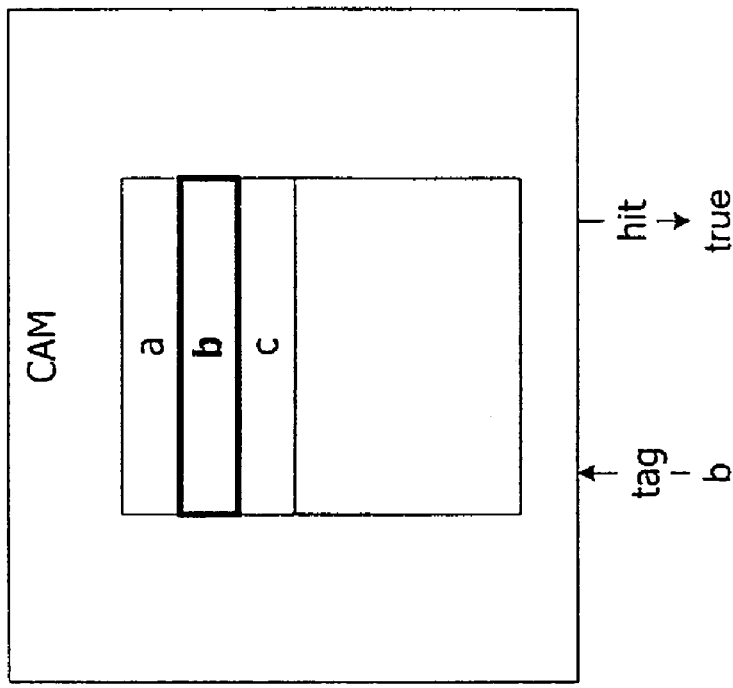
FIGS. 1A and 1B are diagrams of a Random Access Memory (RAM) and a Content Addressable Memory (CAM).
Figure 1A:
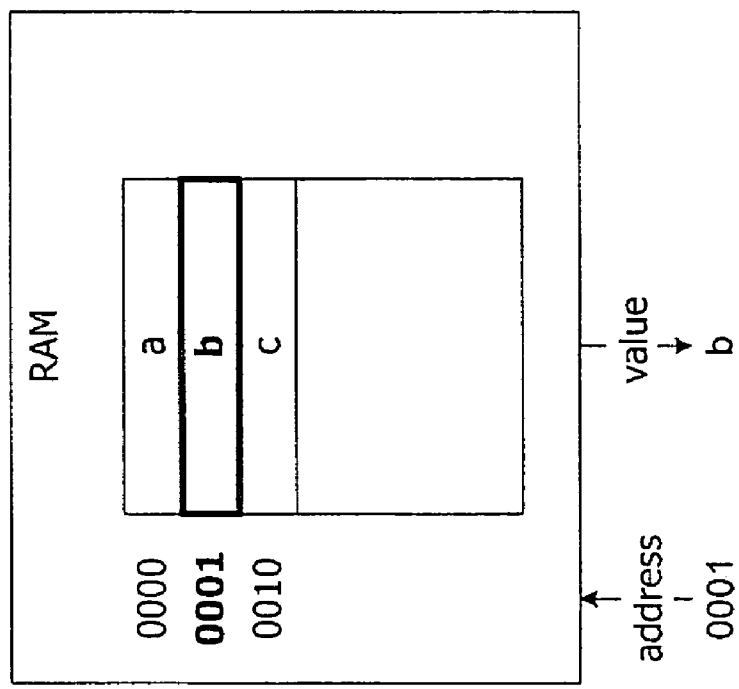
Figure 2A:
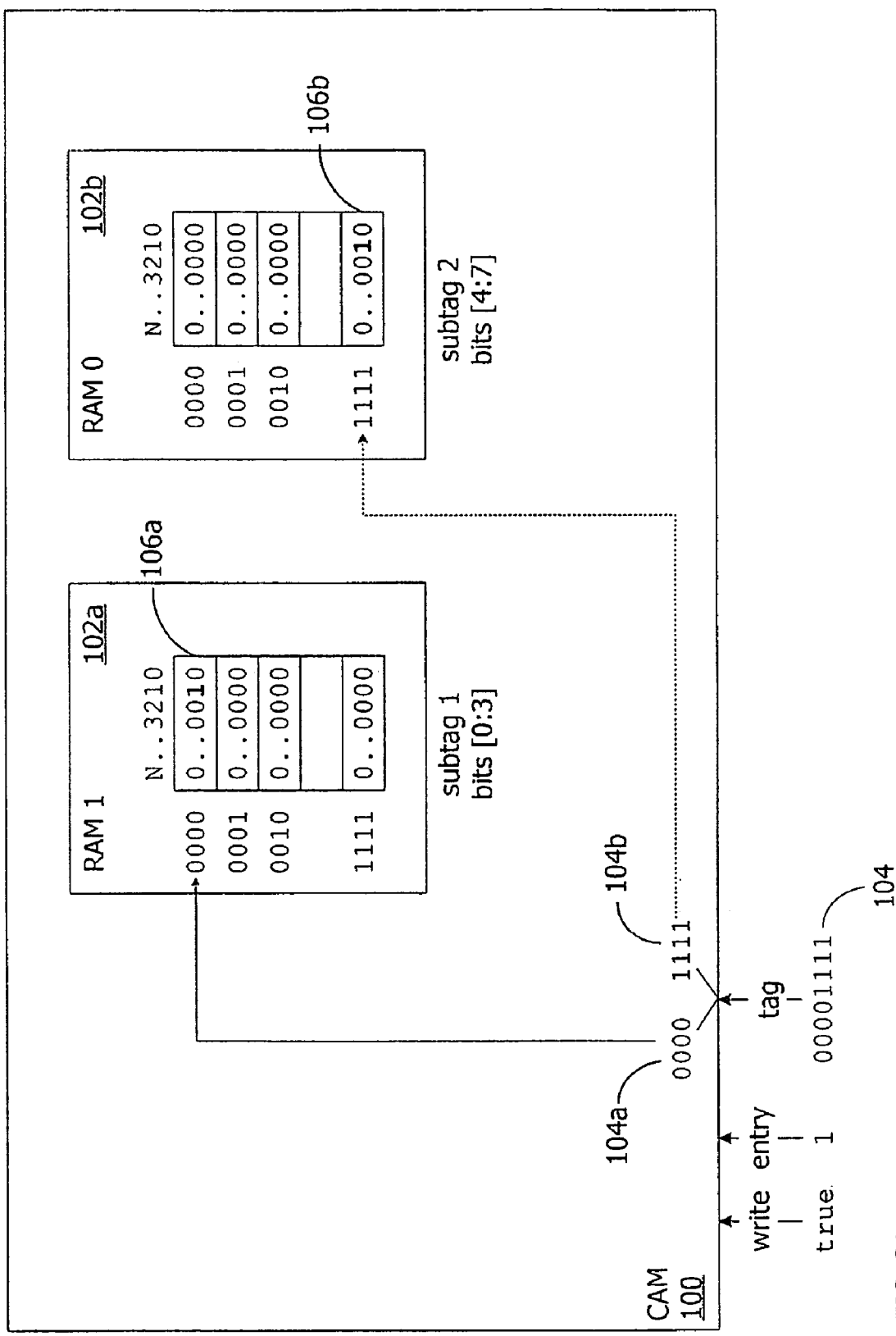
FIGS. 2A–2D illustrate operation of a CAM.

FIG. 2A depicts a CAM 100 constructed from a set of RAM blocks 102a–102b. The CAM 100 performs traditional CAM operations such as tag writes and tag lookups. Unlike traditional CAMs, however, CAM 100 need not explicitly store the bits of tag values written to the CAM. Instead, the CAM 100 can implicitly represent a tag by treating it as a collection of addresses into the RAMs 102a–102b. In other words, instead of storing tag bits of "1010", the CAM 100 can set a single bit at address "1010" of a RAM 102a–102b to note the presence of these bits within the tag. A CAM using this approach can be constructed from elements commonly available in design libraries, yet conserves die space, offers good performance characteristics, and features a flexible geometry.

In greater detail, FIG. 2A depicts a sample CAM 100 constructed from two RAM blocks 102a–102b. In this example, each RAM block 102a–102b has a 4-bit address space ranging from "0000" to "1111". These 4-bit addresses can be combined to represent an 8-bit tag value. For example, an 8-bit tag value 104 of "00001111" can be divided into two 4-bit RAM address: an address of "0000" 104a from the first set of 4-bits and an address of "1111" 104b from the second set of 4-bits. The different sets of bits forming the addresses are referred to as "subtags". That is, the first subtag is formed by the first 4-bits of a tag while the second subtag is formed by the second set of 4-bits. In the configuration shown, each subtag is associated with a given RAM 102a–102b. For example, the value of subtag 104a is used as the address into RAM 102a while the value of subtag 104b is used as the address into RAM 102b.

To represent a tag 104 being written to the CAM 100, the CAM 100 stores data at each address 104a, 104b to note the presence of the address bits/subtag value within the tag 104. For example, as shown, to represent tag value "00001111" 104, the CAM 100 sets a bit (bolded) at address 104a in RAM 102a and a bit (bolded) at address 104b in RAM 102b. Thus, treating the tag value as a concatenation of addresses distributes representation of the tag across the different RAMs 102a–102b.

The bolded bits in FIG. 2A represent a single CAM entry (e.g., entry #1). The CAM 100, however, can support multiple entries. For example, as shown, a given RAM 102a, 102b address can store data 106a identifying the different entries sharing a given subtag value. For example, row 106a identifies which of N CAM entries have "0000" as their first subtag value (e.g., tags starting "0000 . . . ") while row 106b identifies CAM entries having "1111" as their second four-bits (e.g., tags ending in " . . . 1111"). A "list" of entries sharing the same values for a given subtag can be encoded in a variety of ways. For example, in FIG. 2A, the rows encode this information as an array of bits where each bit corresponds to an entry. The position of a bit within the array identifies whether a corresponding entry features the subtag value. For instance, as shown, row 106a stores one bit for each CAM entry. The bit in column 1 of row 106a identifies CAM entry 1 as having a first subtag value of "0000". Similarly, the bit in column 1 of row 106b identifies CAM entry 1 as having a second subtag value of "1111".

Figure 2B:
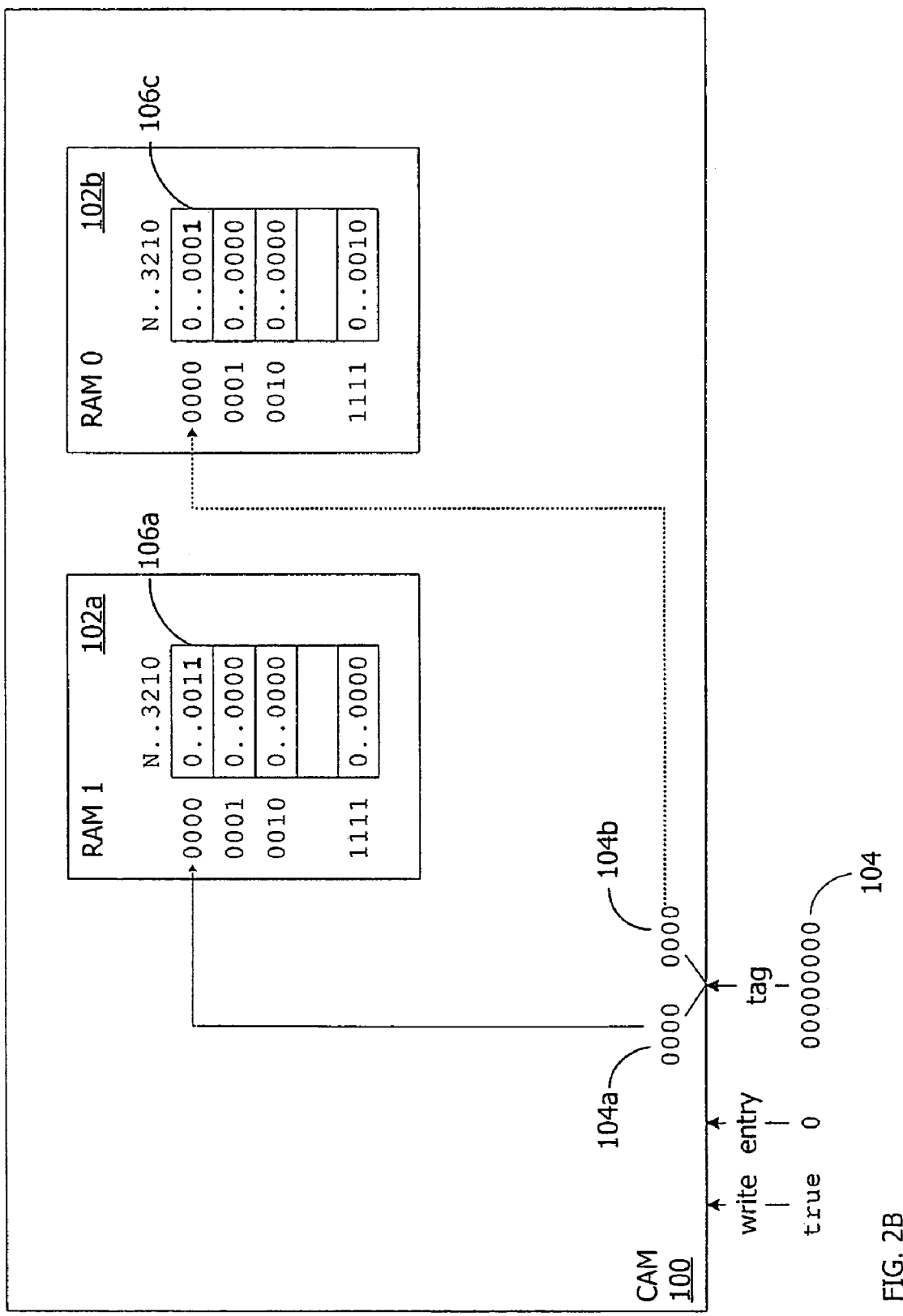

FIG. 2B illustrates another tag write operation. In this case, a tag of "0000 0000" is being written to CAM entry 0. Thus, a bit (bolded) for entry 0 is set at address "0000" of RAM 102a and at address "0000" of RAM 102b. Since the previously written tag (FIG. 2A) of "00001111" and the tag value of "00000000" share the same first subtag value, row 106a features bits identifying both entry 0 and 1 as entries having a first subtag 104a value of "0000".

Figure 2C:
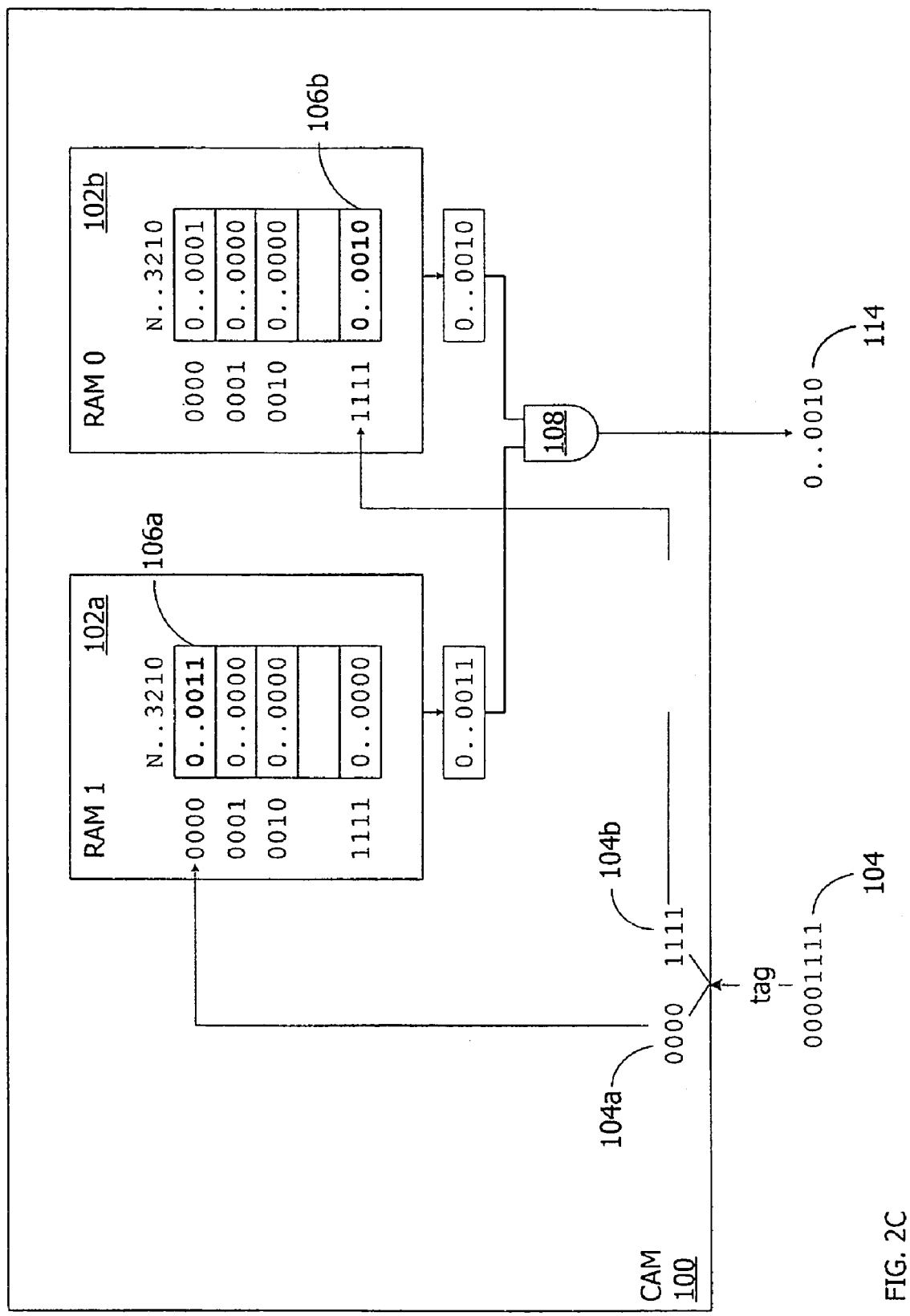

FIG. 2C illustrates a sample CAM lookup operation. In this case, the lookup operation searches for a previously written CAM entry of "0000 1111" (FIG. 2A). As shown, like a write operation, the tag value 104 being searched for is divided into subtags 104a–104b. These subtags 104a–104b are applied as addresses to the RAMs 102a–102b in parallel read operations. The data 106 read from the RAMs 102a–102b identify which entries include the different subtag values 104a, 104b forming the tag 104. For example, the data 106a output by RAM 102a identifies both entries 0 and 1 as having first subtags of "0000" while data 106b output by RAM 102b identifies only CAM entry 0 as having a subtag of "1111". An intersection of these results, indicates that only entry 1 includes both subtags 104a, 104b of the lookup tag 104. Thus, entry 1 is the only exact match or "hit" for the lookup tag.

The CAM 100 can identify hits in a variety of ways. For example, the CAM 100 can perform a logical AND operation on the corresponding bits of data read from the RAMs 102a–102b. In the example shown, the AND 108 operation(s) yield a set of bits 114 having a "1" bit in the position corresponding to entry 1. This result 114, thus, identifies CAM entry 1 as the only CAM entry to include "0000" as the first subtag value and "1111" as the second subtag value.

The CAM 100 can output lookup results in a variety of ways. For example, as shown, the resulting bit vector can be directly output. For example, a bit-vector of "0 . . . 010" can identify entry 1 as being a hit for a lookup tag. Alternately, the results of a CAM 100 lookup can be encoded in other ways. For example, the CAM 100 may include a one-hot to binary encoder that converts a bit vector into a binary number identifying the number of the matching entry. Such a number can then be used as an index into data associated with the tag in a conventional RAM. The resulting bits 114 can also be OR-ed together to generate a binary "hit" (1) or "miss" (0) signal.

Figure 2D:
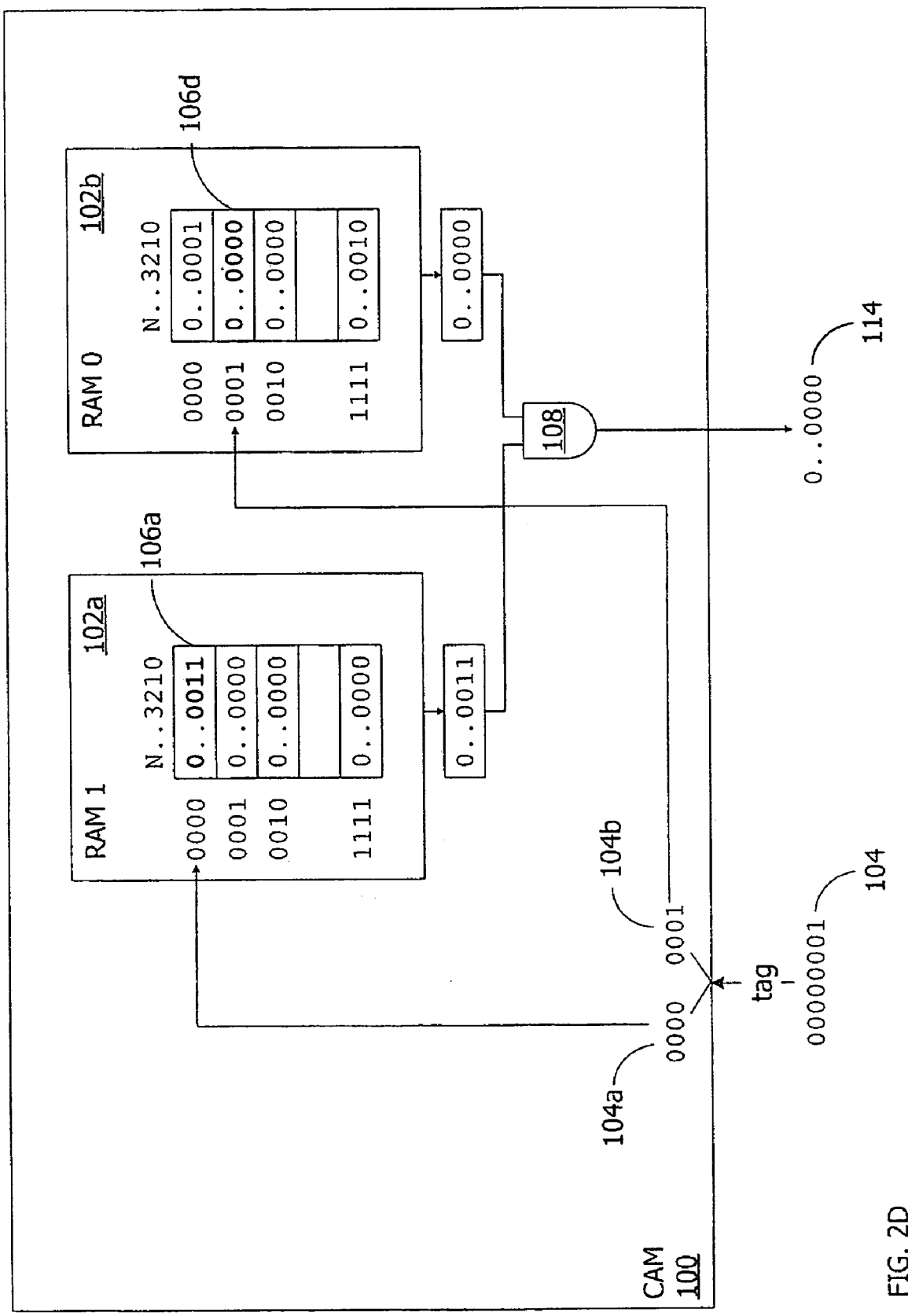

FIG. 2D illustrates another CAM lookup 100, in this case, for a tag value of "0000 0001" 104. As shown, operations on the data 106a, 106d obtained by applying the subtags 104a, 104b as RAM 102a, 102b addresses yields a value of "0 . . . 000" 114. The absence of any "1" bits in the result indicates that no previously stored CAM entry (neither "00001111" FIG. 2A nor "00000000" FIG. 2B) includes both "0000" as a first subtag and "0001" as a second subtag. In this case, OR-ing the resulting bits 114 together would yield a "0" or a miss.

The implementation shown in FIGS. 2A–2D is merely an example and a CAM may feature a wide variety of different configurations and variations. For example, the number of CAM entries can be varied by altering the width of the RAM 102a–102b rows 106. Additionally, the tag length may be varied by using a different number of RAM blocks and/or using RAM blocks with a different address space (e.g., 3-address bits instead of 4). Many other variations of the above are possible. For example, the subtags need not be of equal length. Additionally, the subtags need not be of contiguous bits within a tag. Further, while in FIGS. 2A–2D the addresses used to access the RAMs were directly based on the subtags, the addresses may instead be based on some subtag transformation. For example, the subtag value may be used as an index added to some base address.

Building a CAM from RAM blocks can speed circuit development. For example, RAM blocks are typically found in ASIC (Application Specific Integrated Circuit) design libraries. Assembling a CAM from RAM blocks can provide a solution that is efficient both in terms of access time and circuit size. While the design may use more bits to represent tags than a design assembled from flip-flops or latches, the area occupied by the CAM may nevertheless be smaller. Though the RAM blocks may not provide the speed or compactness of a completely custom design the resulting design is much less complex and time-consuming to develop.

The approach illustrated above can also provide a very efficient way of implementing a ternary CAM. Briefly, a ternary CAM permits tags to be written that match multiple values instead of just one. Ternary tag values can be expressed using an "x" to identify "don't care" wildcard bits that can match either a "1" or "0". For example, a written ternary tag value of "000x 0000" yields a hit for a fully specified lookup tag of "0000 0000" or "0001 0000". The CAM does not actually receive an "x" character for ternary tag values being written, but may instead, for example, receive a "don't-care" bit-mask identifying don't-care bits.

Figure 3:
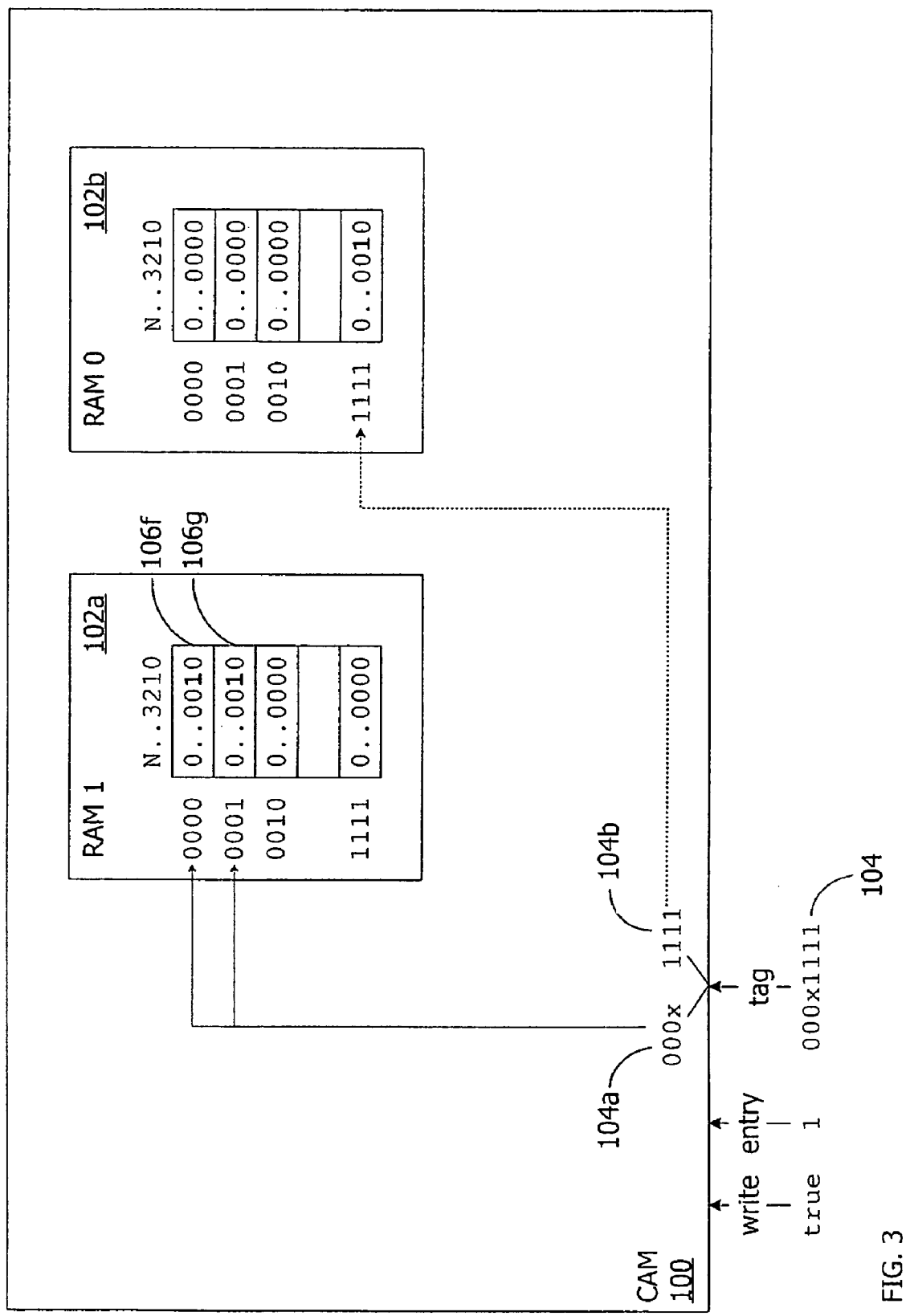
FIG. 3 illustrates operation of a ternary CAM.

As shown in FIG. 3, to represent a ternary tag value being written, the CAM 100 can mark multiple values for the same subtag. For example, as shown, to write a ternary tag value of "000x 0000" in entry "1", the CAM 100 can mark row 106f (address "0000") and row 106g (address "0001") for the entry.

The example shown in FIG. 3 featured a written ternary tag value with a single "don't care" value. However, a ternary tag value being written may feature multiple "don't care" values, though this will result in more entry marking bits being set for the different values of the subtag(s) matching the "don't care" bits.

Performing a lookup of a ternary CAM 100 proceeds in the same manner described above FIGS. 2C and 2D. That is, the CAM accesses "entry-vectors" from the RAMs using addresses based on subtags extracted from a lookup tag. In a ternary CAM, however, it is possible to get multiple matches. For example, written ternary entries of "000x 0000" and "x000 0000" would both match a lookup tag of "0000 0000". Thus, the CAM may feature a priority encoder, which outputs the binary value of the first matching bit.

In addition to handling "don't care" bits, a single CAM entry may be associated with different discrete tag values. For example, a single CAM entry may match "0001 1111", "0010 1111", or "0100 1111" by setting the entry bit for the three different values (e.g., "0001", "0010", and "0100") of the first subtag. This may be accomplished by a series of tag writes to a given entry without invalidating the entry. This can conserve CAM entries. For example, the CAM 100 represents these different values using a single entry instead of three.

Figure 4:
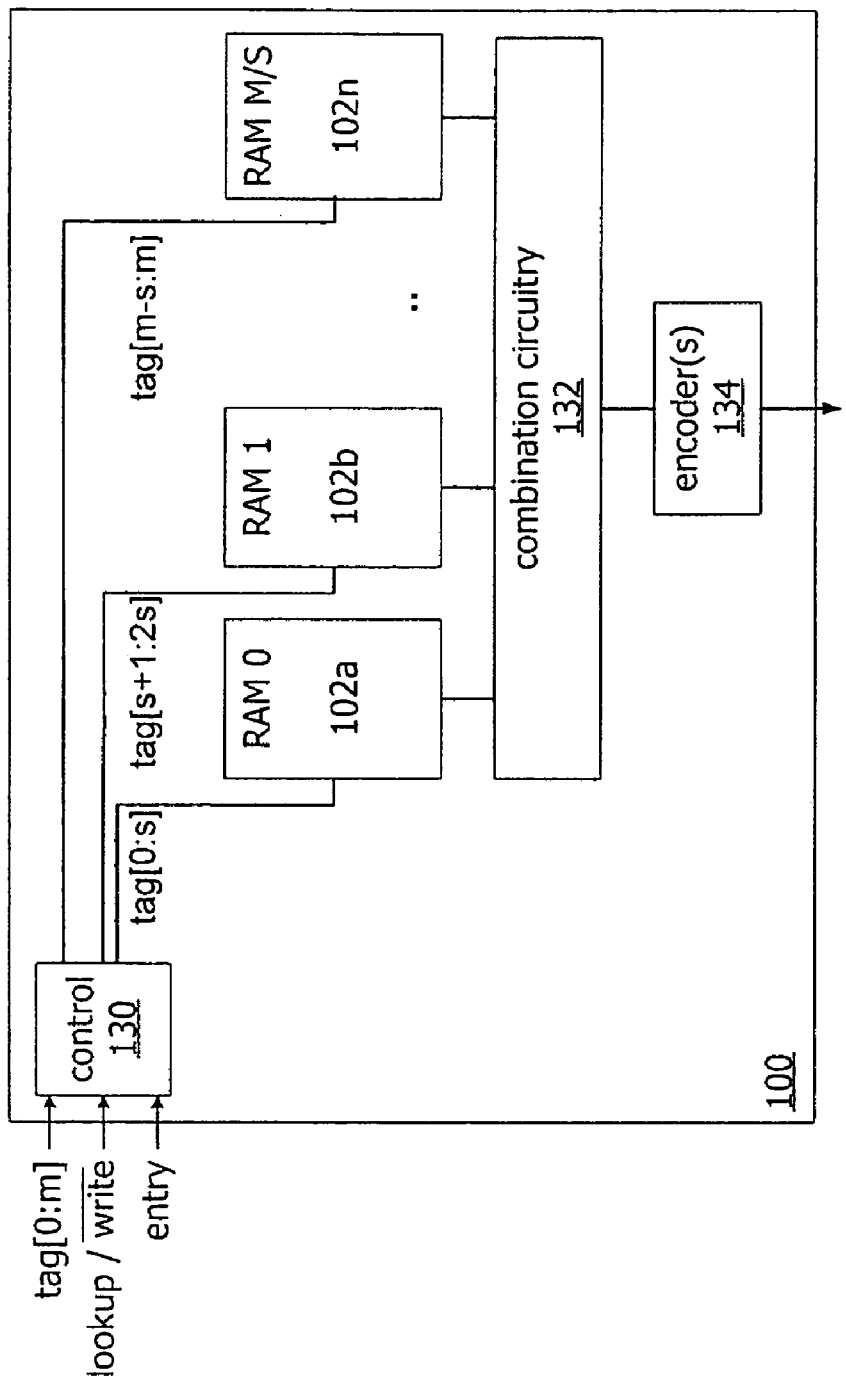
FIG. 4 is a diagram of a CAM.

FIG. 4 illustrates a CAM 100 design in greater detail. The CAM 100 features a tag input, a lookup/write enable input, and an entry input that identifies which entry to use in a tag write operation. The entry input may feed a decoder (not shown) such as a binary to one-hot decoder. An entry number could instead be generated by internal circuitry that allocates and victimizes (e.g., using a Least Recently Used (LRU) algorithm) entries as needed. The CAM 100 may also receive a valid signal (not shown) associated with each entry and a "don't care" bit-mask for ternary tag values being written.

The CAM 100 features control logic 130 that receives the inputs and initiates RAM 102a–102n operations based on the input tag value and operation to perform. For example, in the case of ternary operations, the control logic 130 may issue multiple write operations for different subtag values matching a subtag value including "don't care" bits.

In the example, CAM 100 provides N entries for tags that are m-bits long. The CAM 100 features (m/s) number of subtags and (m/s) number of corresponding RAM 102a–102h blocks, where s is the bit-length of each subtag. As shown, the RAMs 102a–102n feed circuitry 132 that identifies entries featuring each subtag value of a lookup tag. An encoder 134 then further encodes the results.

Figure 5A:
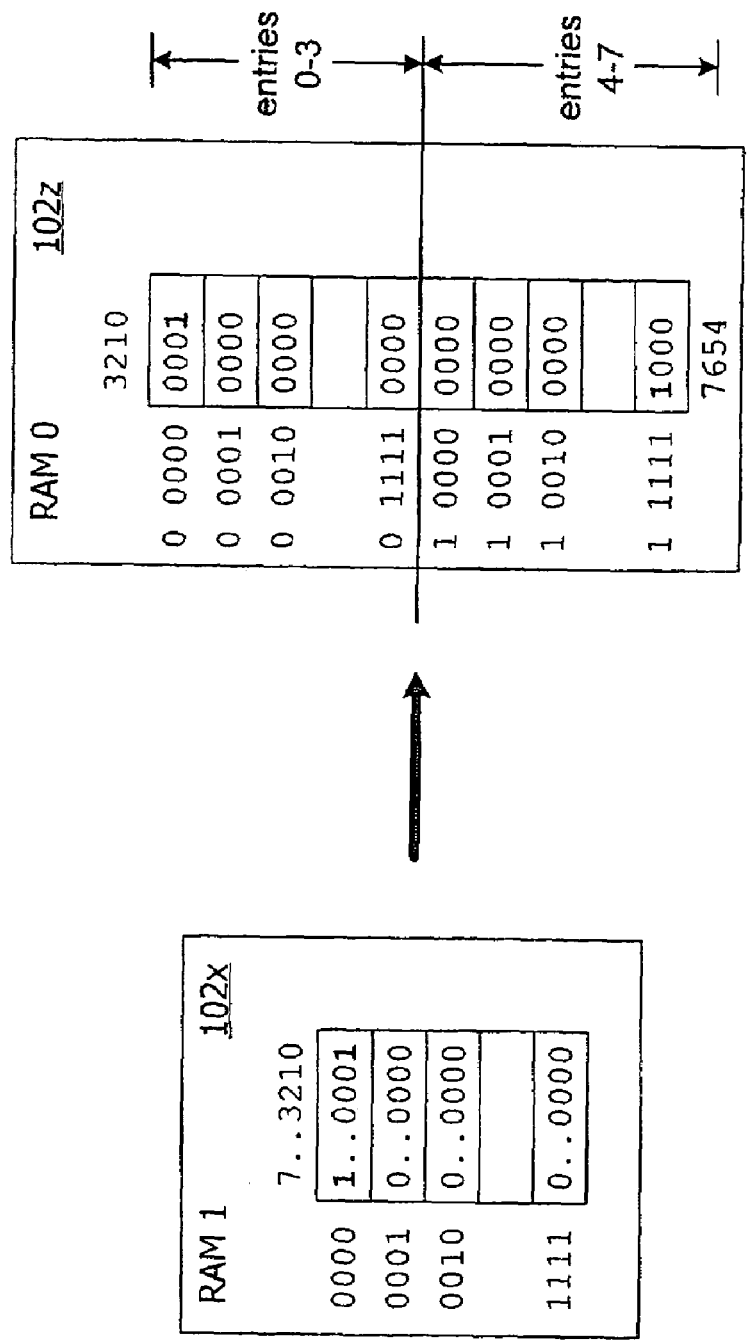
FIGS. 5A and 5C are diagrams illustrating RAM organization.

In the architecture described above, a RAM 102 row included an N-bit entry vector identifying which of N-entries included a given subtag value. FIG. 5A illustrates a variation in which the entry vector is broken into segments stored in different memory sections. For example, as shown in FIG. 5A, a first section of RAM 0 102z stores entry vector segments for entries 0–3 while the second section of RAM 0 102z stores entry vector segments for entries 4–7. The different sections of the RAM 102z are identified by including one or more section bit(s) in an address. For example, the addresses of RAM 0 102z follow a format of [section bit(s)][subtag bits].

Figure 5B:
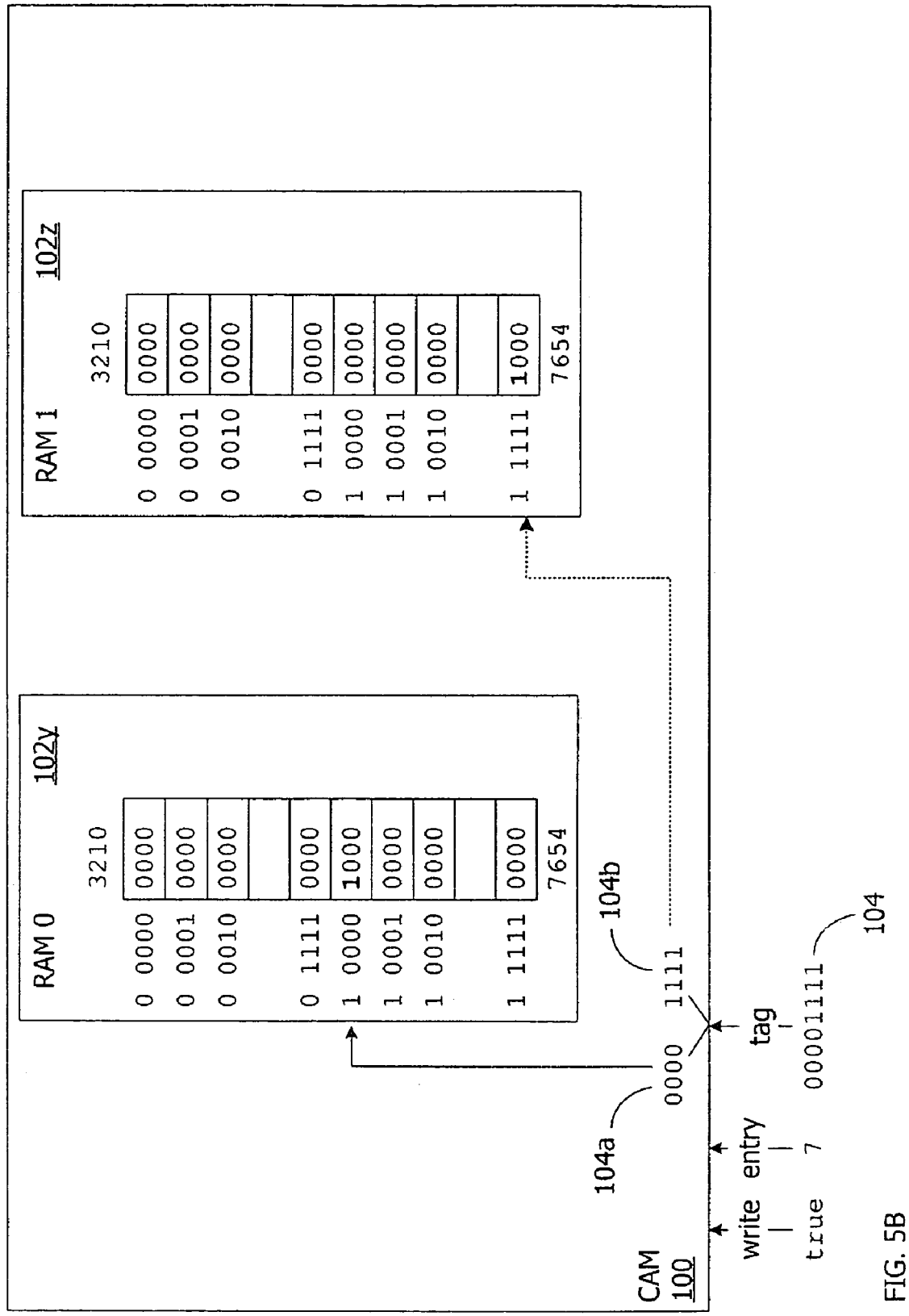
FIGS. 5B and 5D illustrate operation of a CAM.

As shown in FIG. 5B, to write a tag value, the CAM 100 determines which section of memory the entry falls in. For instance, entry "7" falls within the second section of RAMs 102*y* and 102*z*. Thus, to write a tag value to entry 7, the CAM 100 appends a section identifier of "1" to the extracted subtag 104*a*, 104*b* values to set the entry vector bits associated with the 7-th entry.

A tag lookup operation in this scheme may perform a series of lookup operations for each entry vector segment in turn. That is, the CAM 100 may perform a parallel lookup operation on each RAM and logically AND the results for each succeeding RAM section in turn to build a "hit" vector. For example, a first operation will generate lookup results for entries 0–3 while a second operation will obtain lookup results for entries 4–7. As an optimization, the CAM 100 may stop once a hit is found. For example, if entry 1 is a hit, there may not be a need to determine if any of the entries, 4–7, in the succeeding section(s) provides a hit, though lookups for the other entries may continue if multiple hits are possible (e.g., a ternary CAM). As a further optimization, entries may be allocated to cluster frequently accessed tags in lower entry numbers.

This organization of the RAM shown in FIG. 5A can be used to shape the footprint of a CAM. For example, such an organization may lengthen but narrow the RAM blocks as more space is allocated for the different sections. While this approach slows the speed of a lookup, it may also reduce the number of AND gates used, as well as the size of encoding/decoding blocks.

Figure 5C:
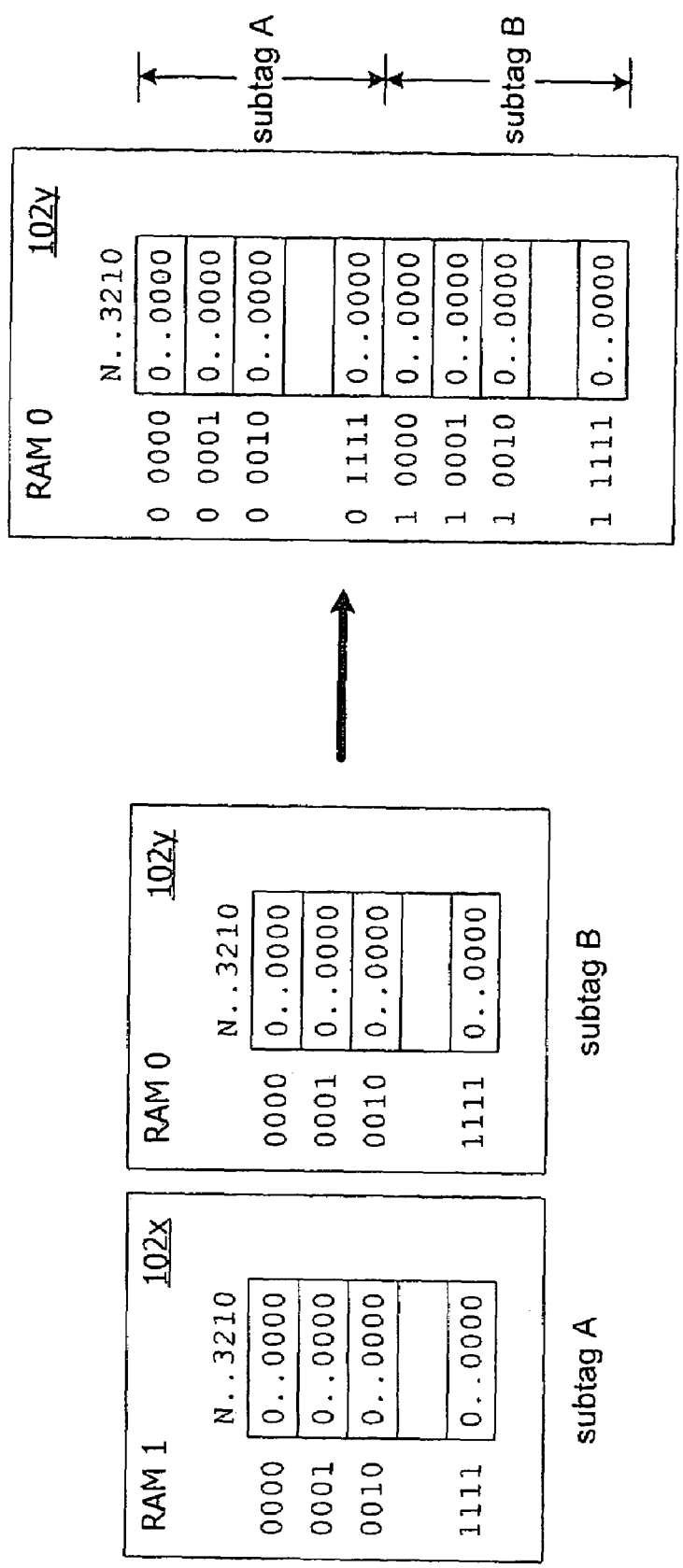

In the implementations illustrated above, the addresses of each RAM block 102*x* corresponded to the possible bit values of a single associated subtag. FIG. 5C illustrates an alternate configuration. As shown, instead of a single associated subtag, a given RAM block 102*y* is associated with multiple subtags. For example, as shown, RAM block 102*y* features a (1+subtag_bitsize) address width, where the additional bit divides the RAM block 102*y* into multiple sections, an upper section corresponding to a first subtag and a lower section corresponding to a second subtag.

Figure 5D:
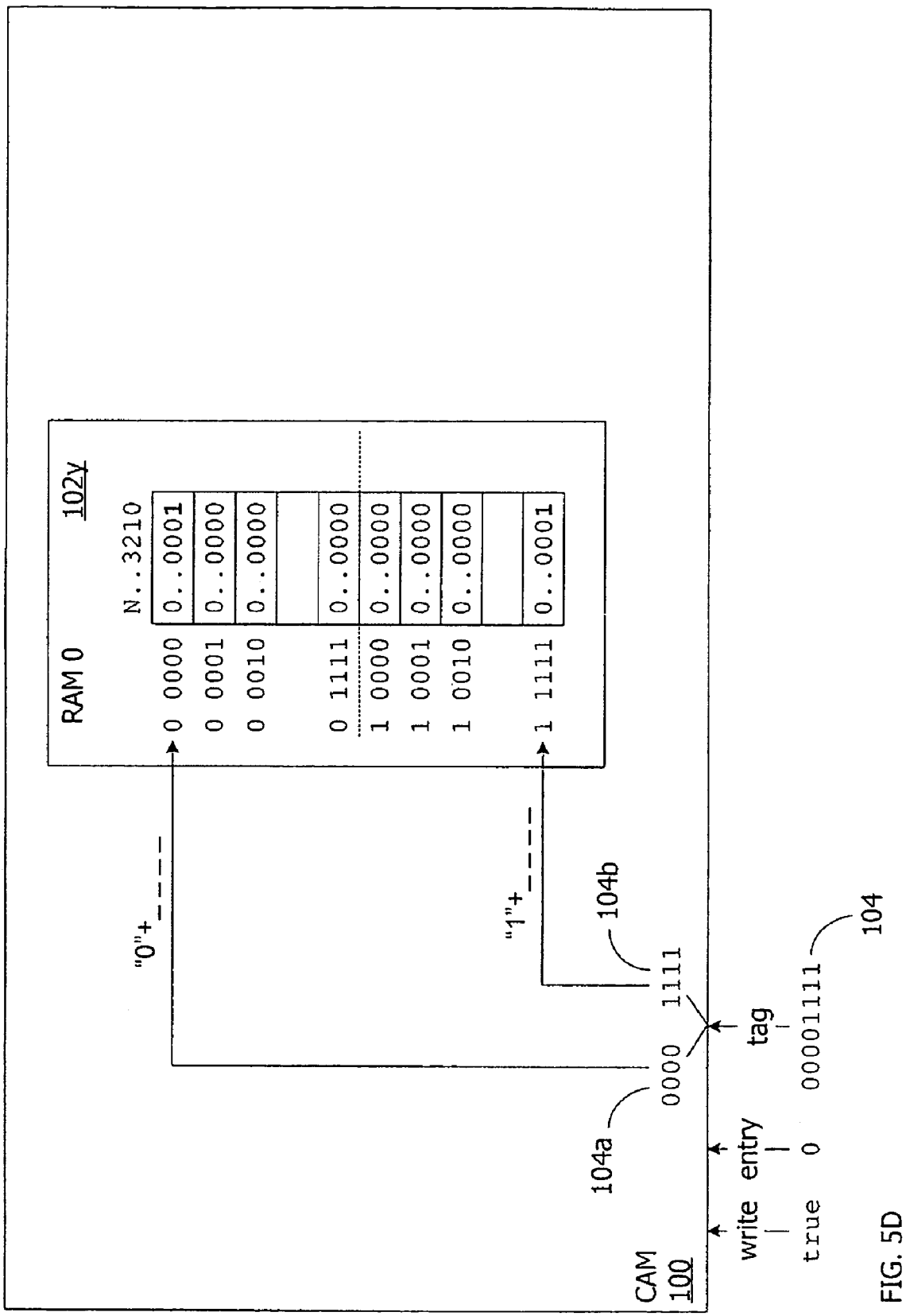

To lookup a tag value, multiple reads of the same RAM 102*z* may occur. For example, as shown in FIG. 5D, a first read may be performed by appending a section identifier (e.g., "0") to the first subtag. A second read may then occur adding a different section identifier (e.g., "1") to the second subtag. The results of the first read may be buffered for ANDing with the results of the second read. As an optimization, if a given read indicates that no entries feature a given subtag value, additional reads may not be performed. That is, if no entries feature a given subtag, no entries could possibly be an exact match for the entire tag.

In the example shown, the RAM block 102*y* featured two different sections, however, a different implementation may feature a RAM with more than two sections. Additionally, the multiple section/subtag RAM block 102*y* may be included in a CAM that also features single section/subtag RAM blocks.

Figure 6A:
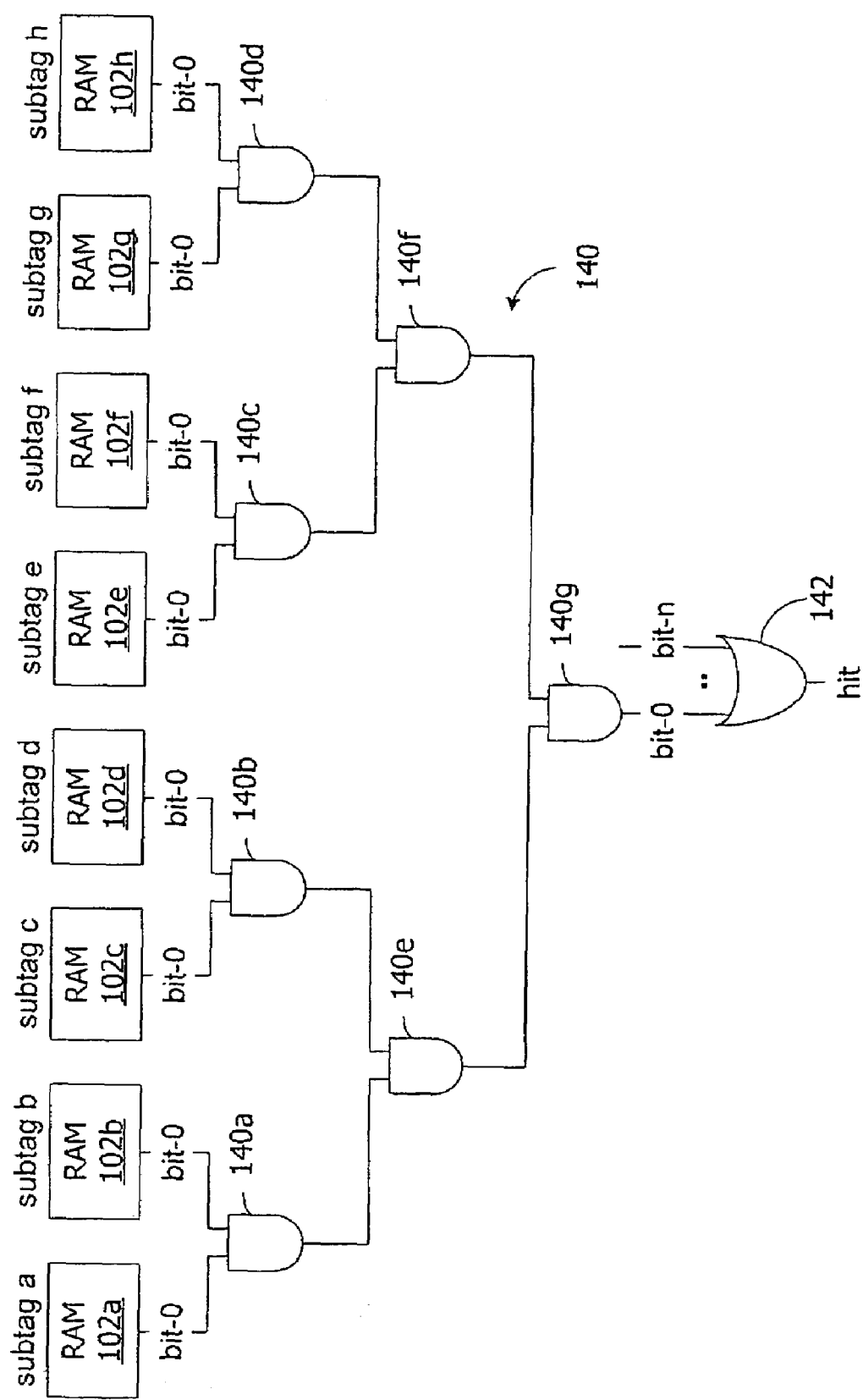
FIGS. 6A–6B are diagrams of circuitry to detect CAM hits and subhits.

FIG. 6A depicts circuitry to determine a lookup match in greater detail. The sample implementation shown features a logic network that operates on a "bit-slice" of the output of eight different RAMs 102*a*–102*h*. For example, gate 104*a* ANDs bit-0 output by RAM 102*a* and bit-0 output by RAM 102*b*. The output of the final AND gate 140*g* indicates whether each of the RAMs 102*a*–102*h* output a "1" for bit-0. A "1" output by gate 140*g* indicates that the entry "0" exactly matches the entire lookup tag.

The CAM can feature N copies of such a network 140, one network 140 for each bit-position. These different networks 140 can feed an OR gate 142. If any of the networks 140 identifies a matching entry (e.g., outputs a "1"), the OR gate 142 will output a "1" hit signal.

The tree 140 of 2-input AND gates allows for modular expansion and regular routing. Additionally, AND gates are often narrower than other gates (e.g., XOR gates). However, other digital logic may be used to perform a similar operation.

Figure 6B:
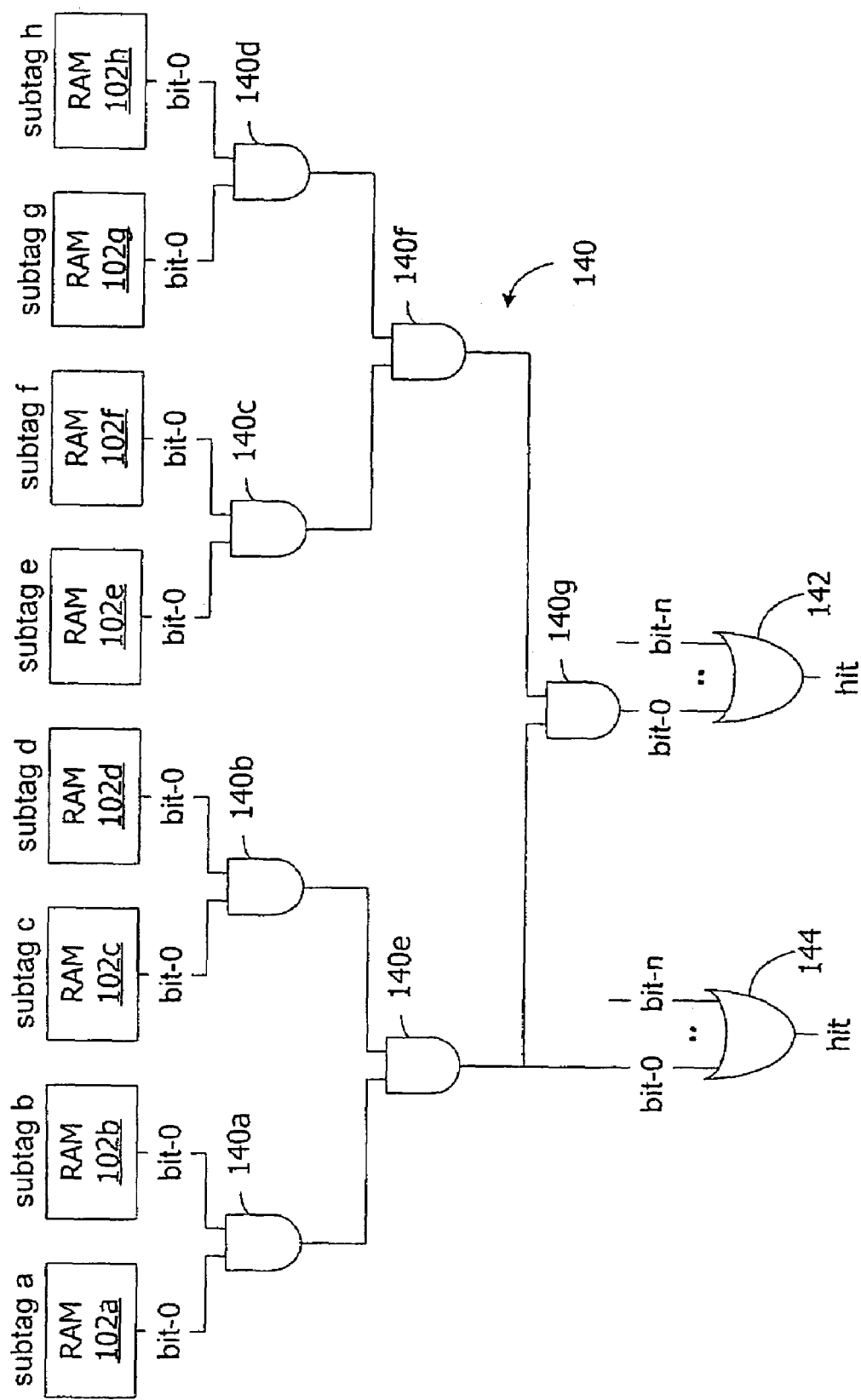

The arrangement shown in FIG. 6A detects exact matches for an entire lookup tag. However, at little incremental cost, the CAM can perform simultaneous searches for subtag or subtag combination matches in a single lookup. For example, as shown in FIG. 6B, adding a single logic gate 144 fed by intermediate points in the AND network 140 produces a signal identifying a match of the first four subtags tracked by RAMs 102*a*–102*d*, irrespective of whether these entries feature the remaining subtag values of the lookup tag. That is, OR gate 144 is fed a "1" if an entry matches subtags a–d tracked by the first four RAMs 102*a*–102*d*. Assuming the OR gate 144 receives the output of logic networks for other bit-positions, the OR gate 144 will output a "hit" if any entry is a partial match.

The logic 144 shown is a simple, albeit powerful, example of the minimal circuitry that can support subtag matching. However, based on the application, more than one additional gate can be used, to give many different subtag match outputs. In addition, the matching logic can be altered by tapping into different points within a logic network 140. Additionally, other circuitry may be included to perform more complicated Boolean operations for example, by include an inverter (e.g., subtag A but NOT subtag B) or other logic gate.

Partial tag matching can speed a variety of operations commonly used in packet processing packet. For example, a tag may be constructed from a packet's network source and destination address and source and destination ports. An exact match can identify a packet as matching a particular flow. A subtag match, however, on source and destination address can be used to identify traffic that should be blocked.

The techniques described above may be implemented in a variety of hardware environments. For example, Content Addressable Memories (CAM) are used in numerous applications in microprocessors, network processors, IO controllers, and other digital systems. For example, the CAM may be included within a multi-processor device such as a network processor.

Figure 7:
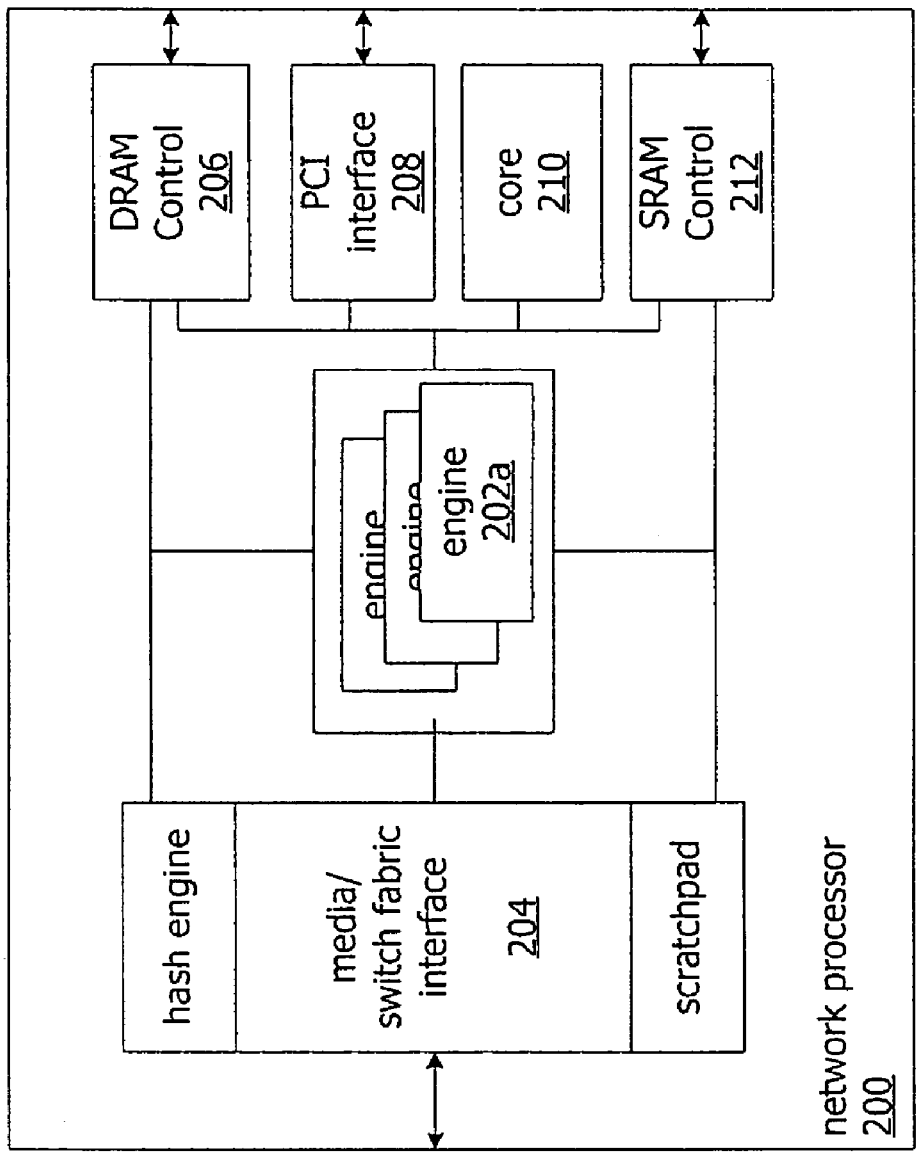
FIG. 7 is a diagram of a network processor.

For instance, FIG. 7 depicts an example of network processor 200. The network processor 200 shown is an Intel® Internet eXchange network Processor (IXP). Other network processors feature different designs.

The network processor 200 shown features a collection of processing engines 202 on a single integrated semiconductor die. Each engine 202 may be a Reduced Instruction Set Computing (RISC) processor tailored for packet processing. For example, the engines 202 may not provide floating point or integer division instructions commonly provided by the instruction sets of general purpose processors. Individual engines 202 may provide multiple threads of execution. For example, an engine 202 may store multiple program counters and other context data for different threads.

As shown, the network processor 200 also features at least one interface 202 that can carry packets between the processor 200 and other network components. For example, the processor 200 can feature a switch fabric interface 202 (e.g., a Common Switch Interface (CSIX)) that enables the processor 200 to transmit a packet to other processor(s) or circuitry connected to the fabric. The processor 200 can also feature an interface 202 (e.g., a System Packet Interface (SPI) interface) that enables the processor 200 to communicate with physical layer (PHY) and/or link layer devices (e.g., MAC or framer devices). The processor 200 also includes an interface 208 (e.g., a Peripheral Component Interconnect (PCI) bus interface) for communicating, for example, with a host or other network processors.

As shown, the processor 200 also includes other components shared by the engines 202 such as a hash engine, internal scratchpad memory shared by the engines, and memory controllers 206, 212 that provide access to external memory shared by the engines. The network processor 200 also includes a "core" processor 210 (e.g., a StrongARM® XScale®) that is often programmed to perform "control plane" tasks involved in network operations. The core processor 210, however, may also handle "data plane" tasks.

The engines 202 may communicate with other engines 202 via the core 210 or other shared resources. The engines 202 may also intercommunicate via neighbor registers directly wired to adjacent engine(s) 204. Individual engines 202 may feature a CAM as described above. Alternately, a CAM may be a resource shared by the different engines 202.

Figure 8:
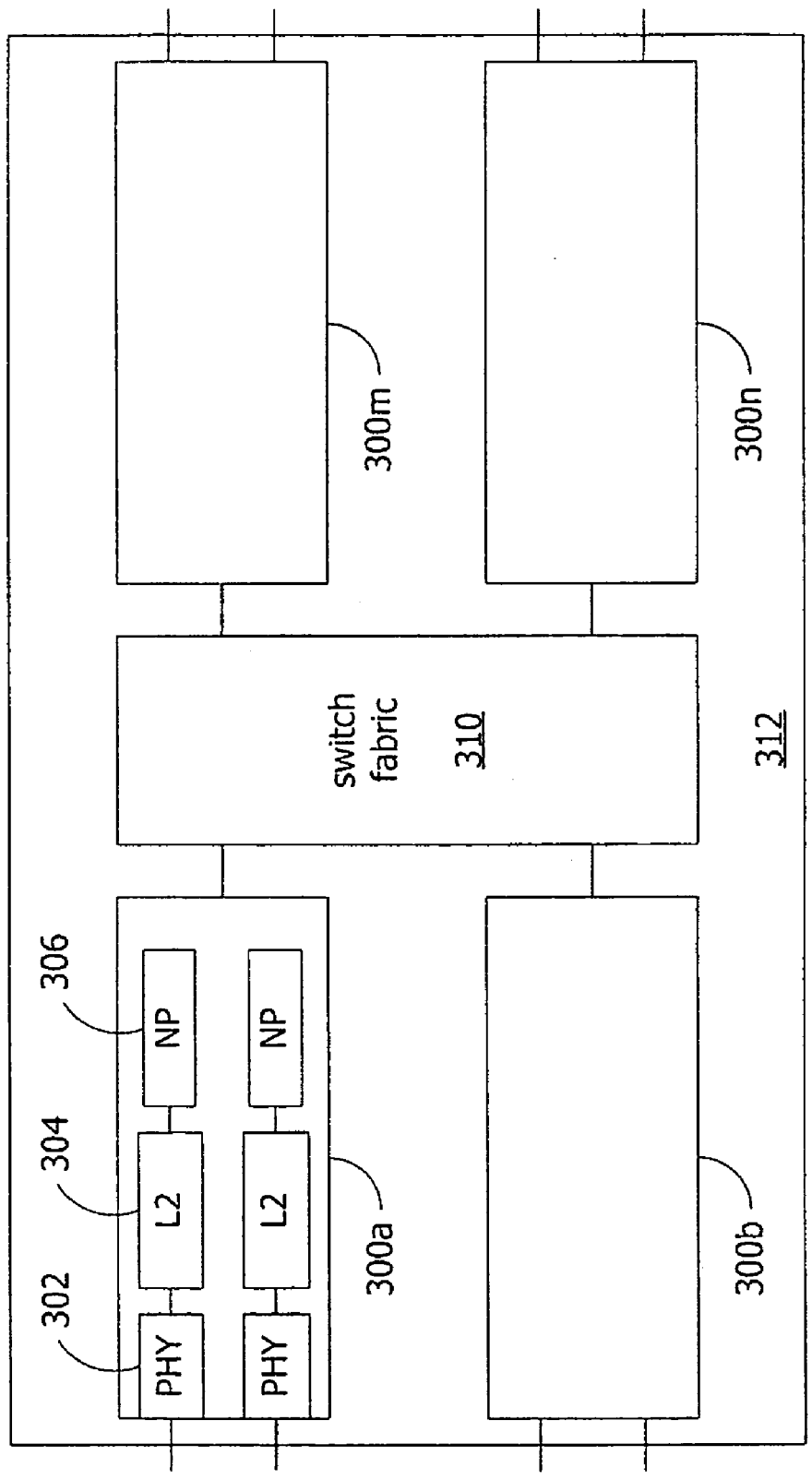
FIG. 8 is a diagram of a network forwarding device.

FIG. 8 depicts a network device that can process packets using a CAM described above. As shown, the device features a collection of line cards 300 ("blades") interconnected by a switch fabric 310 (e.g., a crossbar or shared memory switch fabric). The switch fabric, for example, may conform to CSIX or other fabric technologies such as HyperTransport, Infiniband, PCI, Packet-Over-SONET, RapidIO, and/or UTOPIA (Universal Test and Operations PHY Interface for ATM).

Individual line cards (e.g., 300a) may include one or more physical layer (PHY) devices 302 (e.g., optic, wire, and wireless PHYs) that handle communication over network connections. The PHYs translate between the physical signals carried by different network mediums and the bits (e.g., "0"-s and "1"-s) used by digital systems. The line cards 300 may also include framer devices (e.g., Ethernet, Synchronous Optic Network (SONET), High-Level Data Link (HDLC) framers or other "layer 2" devices) 304 that can perform operations on frames such as error detection and/or correction. The line cards 300 shown may also include one or more network processors 306 that perform packet processing operations for packets received via the PHY(s) 302 and direct the packets, via the switch fabric 310, to a line card providing an egress interface to forward the packet. Potentially, the network processor(s) 306 may perform "layer 2" duties instead of the framer devices 304. The CAM may be used within a network processor or other circuitry within one of the line cards.

While FIGS. 7 and 8 described specific examples of a network processor and a device incorporating network processors, the techniques may be implemented in a variety of architectures including network processors and network devices having designs other than those shown. Additionally, the techniques may be used in a wide variety of network devices (e.g., a router, switch, bridge, hub, traffic generator, and so forth).

The term circuitry as used herein includes hardwired circuitry, digital circuitry, analog circuitry, programmable circuitry, and so forth. The programmable circuitry may operate on computer programs.

Other embodiments are within the scope of the following claims.

What is claimed is:

1. A content addressable memory, comprising:
   at least one tag input;
   at least one random access memory;
   circuitry to:
   perform multiple read operations of the at least one random access memory for multiple, different ones of the read operations specifying an address based on different subsets of tag bits; and
   digital logic circuitry coupled to the at least one random access memory, the circuitry including digital logic gates to:
      determine whether a lookup tag matches one or more entries represented by data stored in the random access memory based on each of the different subsets of the tag bits;
      determine whether a portion of the lookup tag matches a portion of one or more entries represented by the data stored in the random access memory based on less than all of the different subsets of tag bits; and
      simultaneously outputting (1) at least one match signal based on whether the lookup tag matches one or more entries represented by the data stored in the random access memory based on each of the different subsets of the tag bits and (2) at least one match signal based on whether the portion of the lookup tag matches a portion of one or more entries represented by the data stored in the random access memory based on less than all of the different subsets of the tag bits.

2. The content addressable memory of claim 1, wherein the digital logic circuitry further comprises digital logic gates to determine whether a lookup tag matches all of the different subsets of tag bits.

3. The content addressable memory of claim 1, wherein the circuitry comprises multiple networks of digital logic gates, individual ones of the networks operating on the same bit-positions of data output by the at least one random access memory.

4. The content addressable memory of claim 3, wherein the individual networks comprise a tree of AND gates.

5. The content addressable memory of claim 4, wherein the circuitry comprises an OR-gate fed by the networks.

6. The content addressable memory of claim 1, wherein the circuitry comprises digital logic including a NOT operation.

7. The content addressable memory of claim 1, wherein the at least one random access memory comprises multiple random access memories.

8. The content addressable memory of claim 7, wherein the number of tag subsets used in the multiple read operations is equal to the number of random access memories.

9. The content addressable memory of claim 8, wherein each of the tags subsets forms an address applied to each of the respective random access memories.

10. The content addressable memory of claim 9, wherein the multiple read operations comprise more than one read operation applied to the same random access memory.

11. The content addressable memory of claim 1, wherein the circuitry is constructed to perform at least two of the read operations in parallel.

12. The content addressable memory of claim 1, wherein the circuitry further comprises circuitry to write bits to the at least one random access memory in response to a tag value to be written to the content addressable memory.

13. The content addressable memory of claim 12,
wherein the tag value to be written comprises a tag value including at least one "don't care" bit; and
wherein the circuitry to write bits comprises circuitry to set bits for different subsets of tag values occupying the same bit positions.

14. A method, comprising:
dividing a received content addressable memory lookup tag value into multiple subtags;
performing multiple read operations of at least one random access memory using addresses based on the multiple, respective, subtags;
determining whether the lookup tag matches one or more entries represented by data stored in the at least one random access memory based on each of the multiple subtags;
determining whether a portion of the lookup tap matches a portion of one or more entries represented by the data stored in the at least one random access memory based on less than all of the multiple subtags; and
simultaneously outputting (1) at least one match signal based on whether the lookup tag matches one or more entries represented by the data stored in the random access memory based on each of the multiple subtags and (2) at least one match signal based on whether the portion of the lookup tag matches a portion of one or more entries represented by the data stored in the random access memory based on less than all of the multiple subtags.

15. The method of claim 14, wherein performing multiple read operations comprises using each of the multiple subtags as at least a portion of an address specified in the read operations.

16. The method of claim 14, wherein the at least one random access memory comprises multiple random access memories.

17. The method of claim 16, wherein the multiple random access memories store a bit vector of entry values at the subtag addresses.

18. The method of claim 14, further comprising:
receiving a tag to write; and
setting bits in the at least one random access memory based on the received tag.

19. The method of claim 18,
wherein receiving a tag comprises receiving a tag including at least one "don't care" bit; and
wherein the setting bits comprises writing entry data associated with multiple values of the same subtag within a one of the at least one random access memories.

20. A network forwarding device, comprising:
a switch fabric; and
multiple line cards interconnected by the switch fabric, individual ones of the line cards comprising:
at least one network port; and
circuitry to process packets received via the at least one port, the digital logic circuitry including a content addressable memory, the content addressable memory comprising:
at least one tag input;
at least one output;
at least one random access memory;
content addressable memory circuitry to:
perform multiple read operations of the at least one random access memory for multiple, different ones of the read operations specifying an address based on different subsets of tag bits; and
digital logic circuitry coupled to the at least one random access memory, the circuitry including digital logic gates to:
determine whether a lookup tap matches one or more entries represented by data stored in the random access memory based on each of the different subsets of the tag bits;
determine whether a portion of the lookup tag matches a portion of one or more entries represented by the data stored in the random access memory based on less than all of the different subsets of tag bits; and
simultaneously outputting (1) at least one match signal based on whether the lookup tag matches one or more entries represented by the data stored in the random access memory based on each of the different subsets of the tag bits and (2) at least one match signal based on whether the portion of the lookup tag matches a portion of one or more entries represented by the data stored in the random access memory based on less than all of the different subsets of the tag bits.

21. The network forwarding device of claim 20, wherein at least one of the line cards comprises a network processor having multiple multi-threaded engines integrated on a single die.

* * * * *